(12) United States Patent
Kusuyama

(10) Patent No.: US 11,310,914 B2
(45) Date of Patent: Apr. 19, 2022

(54) CIRCUIT BOARD, CIRCUIT MODULE, METHOD OF MANUFACTURING CIRCUIT BOARD, AND METHOD OF MANUFACTURING CIRCUIT MODULE

(71) Applicant: Murata Manufacturing Co., Ltd., Kyoto (JP)

(72) Inventor: Takafumi Kusuyama, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/710,022

(22) Filed: Dec. 11, 2019

(65) Prior Publication Data

US 2020/0120806 A1    Apr. 16, 2020

Related U.S. Application Data

(63) Continuation of application No. PCT/JP2018/022328, filed on Jun. 12, 2018.

(30) Foreign Application Priority Data

Jun. 16, 2017   (JP) .............................. JP2017-119156

(51) Int. Cl.
   *H05K 1/18*    (2006.01)
   *H05K 3/34*    (2006.01)
   *H05K 3/46*    (2006.01)

(52) U.S. Cl.
   CPC ........... *H05K 1/188* (2013.01); *H05K 3/3473* (2013.01); *H05K 3/4661* (2013.01); *H05K 2203/072* (2013.01); *H05K 2203/0723* (2013.01)

(58) Field of Classification Search
   CPC .... H05K 1/188; H05K 3/3473; H05K 3/4661; H05K 2203/072; H05K 2203/0723;
   (Continued)

(56) References Cited

U.S. PATENT DOCUMENTS

2007/0013064 A1    1/2007   Murayama et al.
2007/0096292 A1*   5/2007   Machida ............. H01L 23/5389
                                                          257/700
(Continued)

FOREIGN PATENT DOCUMENTS

JP    2001-094033 A    4/2001
JP    2002-343904 A    11/2002
(Continued)

OTHER PUBLICATIONS

International Search Report for International Application No. PCT/JP2018/022328 dated Aug. 14, 2018.
(Continued)

*Primary Examiner* — Steven T Sawyer
(74) *Attorney, Agent, or Firm* — Pearne & Gordon LLP

(57) ABSTRACT

A circuit board includes a board body, a first electrode, and a second electrode. The board body contains a resin material. The first electrode is disposed on a first main surface of the board body and includes a first electrode base and a first coating film that covers at least a part of an outer surface of the first electrode base. The second electrode is disposed on the first main surface of the board body and includes a pillar-shaped structure that includes a second electrode base, a first plating film that is disposed on the second electrode base, and a first plating structure having a first end directly connected to the first plating film, and a second coating film that covers at least a part of an outer surface of the pillar-shaped structure.

1 Claim, 6 Drawing Sheets

(58) Field of Classification Search
CPC ..... H05K 2201/0367; H05K 2203/025; H05K 2201/10674; H05K 3/284; H05K 2203/0577; H05K 3/4007; H05K 2201/0347; H01L 2224/16238; H01L 2224/131; H01L 2924/18161; H01L 2224/81205; H01L 23/5389; H01L 21/4846; H01L 21/4853; H01L 23/49811; H01L 25/04; H01L 25/18; H01L 21/76852

See application file for complete search history.

(56) References Cited

U.S. PATENT DOCUMENTS

| | | | |
|---|---|---|---|
| 2008/0217792 A1 | 9/2008 | Onodera et al. | |
| 2011/0108315 A1* | 5/2011 | Kung | H05K 3/421 174/261 |
| 2012/0125668 A1* | 5/2012 | Chang | H05K 3/4007 174/257 |
| 2013/0313695 A1* | 11/2013 | Noichi | H01L 23/49582 257/668 |
| 2014/0262442 A1* | 9/2014 | Nomura | H05K 3/4007 174/250 |
| 2015/0179621 A1* | 6/2015 | Matsumoto | H01L 23/49811 257/737 |
| 2015/0235991 A1 | 8/2015 | Gu et al. | |
| 2016/0073499 A1 | 3/2016 | Ogawa et al. | |
| 2016/0351544 A1* | 12/2016 | Machida | H01L 25/50 |
| 2017/0317000 A1* | 11/2017 | Nishimura | H01L 23/13 |

FOREIGN PATENT DOCUMENTS

| | | |
|---|---|---|
| JP | 2007-027381 A | 2/2007 |
| JP | 2007-059937 A | 3/2007 |
| JP | 2008-218926 A | 9/2008 |
| JP | 2014-179476 A | 9/2014 |
| JP | 5790682 B2 | 10/2015 |
| JP | 2017-505999 A | 2/2017 |
| WO | 2014/188760 A1 | 11/2014 |

OTHER PUBLICATIONS

Written Opinion for International Application No. PCT/JP2018/022328 dated Aug. 14, 2018.

* cited by examiner

PRIOR ART

CIRCUIT BOARD, CIRCUIT MODULE, METHOD OF MANUFACTURING CIRCUIT BOARD, AND METHOD OF MANUFACTURING CIRCUIT MODULE

This is a continuation of International Application No. PCT/JP2018/022328 filed on Jun. 12, 2018 which claims priority from Japanese Patent Application No. 2017-119156 filed on Jun. 16, 2017. The contents of these applications are incorporated herein by reference in their entireties.

BACKGROUND OF THE DISCLOSURE

Field of the Disclosure

The invention relates to a circuit module including a board that contains a resin material, an electronic component that is connected at a side of a first main surface of the board and that includes an electronic circuit, an external connection terminal that is connected to the electronic circuit, and a resin layer that is disposed at a side of the first main surface of the board.

Description of the Related Art

A known circuit module includes a board that contains a resin material, an electronic component that is connected at a side of a first main surface of the board, an external connection terminal, and a resin layer that is disposed at a side of the first main surface of the board. An example of such a circuit module is disclosed in Japanese Patent No. 5790682 (Patent Document 1).

FIG. 10 is a sectional view of a principal part of a circuit module 300 disclosed in Patent Document 1. The circuit module 300 includes an external connection terminal 303 and a resin layer 305 that are disposed at a side of a first main surface of a board (not illustrated) that contains a glass epoxy resin. The external connection terminal 303 is located in the resin layer 305 such that a first end protrudes from a surface 305P of the resin layer 305.

The external connection terminal 303 includes a metal pillar 303a, a first coating portion 303c, and a second coating portion 303d. The metal pillar 303a is obtained in a manner in which a metal pin that is molded by using, for example, a Cu material in advance or conductive paste of the Cu material is filled in a through-hole that is formed in the resin layer 305 and solidified. An example of the material of the resin layer 305 is an epoxy resin.

A first end of the metal pillar 303a is inside the resin layer 305. A first end of the first coating portion 303c is connected to the first end of the metal pillar 303a, and a second end thereof protrudes from the surface 305P of the resin layer 305. The second coating portion 303d covers a surface of the first coating portion 303c. The first coating portion 303c is formed by using, for example, a Ni material by plating. The second coating portion 303d is formed by using, for example, an Au material by plating, spattering, or depositing. A connection member S such as a solder bump is formed on a surface of the second coating portion 303d.

Patent Document 1: Japanese Patent No. 5790682

BRIEF SUMMARY OF THE DISCLOSURE

However, there is a risk that the use of the metal pin as the metal pillar 303a of the external connection terminal 303 makes it difficult for the metal pillar 303a to stand upright on the board stably during a manufacturing process. In the case where the metal pillar 303a is composed of the Cu paste that is filled in the through-hole that is formed in the resin layer 305, there is a risk that the electric resistance of the metal pillar 303a increases, and the impedance of the circuit module increases.

Accordingly, it is an object of the invention to provide a circuit board that is easy to manufacture and that keeps the electric resistance of an external connection terminal low, a circuit module that includes the circuit board, a method of manufacturing the circuit board, and a method of manufacturing the circuit module.

In a circuit board according to the invention, the structure of the external connection terminal is improved.

The invention is directed to the circuit board.

The circuit board according to the invention includes a board body, a first electrode, and a second electrode. The board body contains a resin material. The first electrode is disposed on a first main surface of the board body and includes a first electrode base and a first coating film that covers at least a part of an outer surface of the first electrode base. The second electrode is disposed on the first main surface of the board body and includes a pillar-shaped structure and a second coating film that covers at least a part of an outer surface of the pillar-shaped structure.

The pillar-shaped structure includes a second electrode base, a first plating film that is disposed on the second electrode base, and a first plating structure a first end of which is directly connected to the first plating film.

In the circuit board, the second electrode serves as the external connection terminal after an electronic component is connected to the circuit board to provide a circuit module. That is, the circuit board is easy to manufacture because a principal part of the second electrode is manufactured by a plating method. The principal part of the second electrode has a fine plating structure, and accordingly, its electric resistance is kept low.

The invention is also directed to a circuit module.

The circuit module according to the invention includes the circuit board according to the invention, a first electronic component, and a first resin layer. The first resin layer is disposed at a side of the first main surface of the board body. The first electronic component is connected to the first electrode of the circuit board according to the invention and located in the first resin layer such that at least a part of a surface opposite to a surface facing the first electrode is exposed.

A second end of the first plating structure of the second electrode of the circuit board according to the invention is inside an outer surface of the first resin layer parallel to the first main surface of the board body. The second coating film is tubular and covers at least a part of a side surface of the pillar-shaped structure so as not to cover the second end of the first plating structure, and a first end of the second coating film is flush with the second end of the first plating structure.

The circuit module according to the invention includes a coating portion a first main surface of which is connected to the first end of the second coating film and the second end of the first plating structure of the second electrode, and a second main surface of the coating portion is outside the outer surface of the first resin layer parallel to the first main surface of the board body.

The above circuit module includes the circuit board according to the invention. Accordingly, the principal part of the second electrode serving as the external connection terminal is manufactured by the plating method. That is, the circuit module is easy to manufacture, and the electric resistance of the external connection terminal is kept low. The circuit module, which has the above structure, reduces a stress acting at the interface of contact between the external connection terminal and a connection member when being connected to a mother board of an electronic device. Accordingly, the reliability of the connection to the mother board of the electronic device increases.

The invention is also directed to a method of manufacturing a circuit board.

The method of manufacturing the circuit board according to the invention is a method of manufacturing a circuit board including a board body, a first electrode, and a second electrode. The board body contains a resin material. The first electrode includes a first electrode base and a first coating film. The second electrode includes a pillar-shaped structure that includes a second electrode base, a first plating film, and a first plating structure, and a second coating film. The method of manufacturing the circuit board according to the invention includes first to seventh steps described below.

The first step is a step of manufacturing or preparing the board body having a first main surface on which the first electrode base and the second electrode base are disposed. The second step is a step of forming a first power supply film at a side of the first main surface of the board body by electroless plating such that an outer surface of the second electrode base is covered. The third step is a step of forming a first-main-surface plating resist film on the first power supply film such that at least a part of the first power supply film on the second electrode base is exposed.

The fourth step is a step of forming the first plating structure on the exposed first power supply film by electroplating with power supplied via the first power supply film such that the first plating structure is directly connected thereto. The fifth step is a step of removing the first-main-surface plating resist film.

The sixth step is a step of removing the first power supply film except for a portion that is directly connected to the first plating structure and forming the pillar-shaped structure. The pillar-shaped structure includes the second electrode base, the first plating film that corresponds to the remaining portion of the first power supply film that is directly connected to the first plating structure, and the first plating structure a first end of which is directly connected to the first plating film.

The seventh step is a step of forming the first electrode and the second electrode. The first electrode is formed by forming the first coating film such that at least a part of an outer surface of the first electrode base is covered. The second electrode is formed by forming the second coating film such that at least a part of an outer surface of the pillar-shaped structure is covered.

The above method of manufacturing the circuit board enables the circuit board to be readily manufactured, and the electric resistance of the circuit board is kept low because the principal part of the second electrode has a fine plating structure.

The invention is also directed to a method of manufacturing a circuit module.

The method of manufacturing the circuit module according to the invention is a method of manufacturing a circuit module including a circuit board that includes a board body, a first electrode, and a second electrode, a first electronic component, and a first resin layer. The board body contains a resin material. The first electrode includes a first electrode base and a first coating film. The second electrode includes a pillar-shaped structure that includes a second electrode base, a first plating film, and a first plating structure, and a second coating film. The method of manufacturing the circuit module according to the invention includes first to twelfth steps described below.

The first to seventh steps are the same as those in the above method of manufacturing the circuit board according to the invention.

The eighth step is a step of connecting the first electronic component to the first electrode. The ninth step is a step of disposing the first resin layer at a side of the first main surface of the board body such that the entire first electronic component and the second electrode are covered.

The tenth step is a step of polishing the second electrode, the first electronic component, and the first resin layer from surfaces opposite to a surface of the first electronic component facing the first electrode. At this time, a thickness of the first electronic component decreases to a thickness less than that before the first electronic component is connected to the first electrode, and an outer surface that corresponds to a polished section of the first resin layer and that is parallel to the first main surface of the board body, a polished section of the first electronic component, and a polished section of the second electrode are flush with each other.

The eleventh step is a step of etching the polished section of the second electrode such that an exposed section of the second electrode is inside the outer surface of the first resin layer parallel to the first main surface of the board body. The twelfth step is a step of forming a coating portion such that a first main surface is connected to the etched exposed section of the second electrode and a second main surface is outside the outer surface of the first resin layer parallel to the first main surface of the board body.

The above method of manufacturing the circuit module enables the circuit module to be readily manufactured, and the electric resistance of the circuit module is kept low because the principal part of the second electrode serving as the external connection terminal has a fine plating structure, and the reliability of the connection to the mother board of the electronic device is high.

The circuit board according to the invention is easy to manufacture because the principal part of the second electrode is manufactured by a plating method. The principal part of the second electrode has a fine plating structure, and accordingly, the electric resistance is kept low. In the circuit module according to the invention, the second electrode serves as the external connection terminal, and accordingly, the electric resistance of the external connection terminal is kept low. The reliability of the connection to the mother board of the electronic device increases.

The method of manufacturing the circuit board according to the invention enables the circuit board to be readily manufactured, and the electric resistance of the circuit board is kept low because the principal part of the second electrode has a fine plating structure. The method of manufacturing the circuit module according to the invention enables the circuit module to be readily manufactured, and the electric resistance of the circuit module is kept low because the principal part of the second electrode serving as the external connection terminal has a fine plating structure, and the reliability of the connection to the mother board of the electronic device is high.

DETAILED DESCRIPTION OF THE DISCLOSURE

Embodiments of the invention will hereinafter be described to illustrate the features of the invention in more detail. The invention can be used for various circuit modules that include a pillar-shaped external connection terminal for connection to a mother board of an electronic device. In particular, the invention is effectively used for a circuit module that is required to include a thin external connection terminal for reduction in size.

(Circuit Board According to Embodiment)

<Structure of Circuit Board>

The structure of a circuit board 100 that corresponds to a circuit board according to an embodiment of the invention will be described with reference to FIG. 1.

Figure 1:
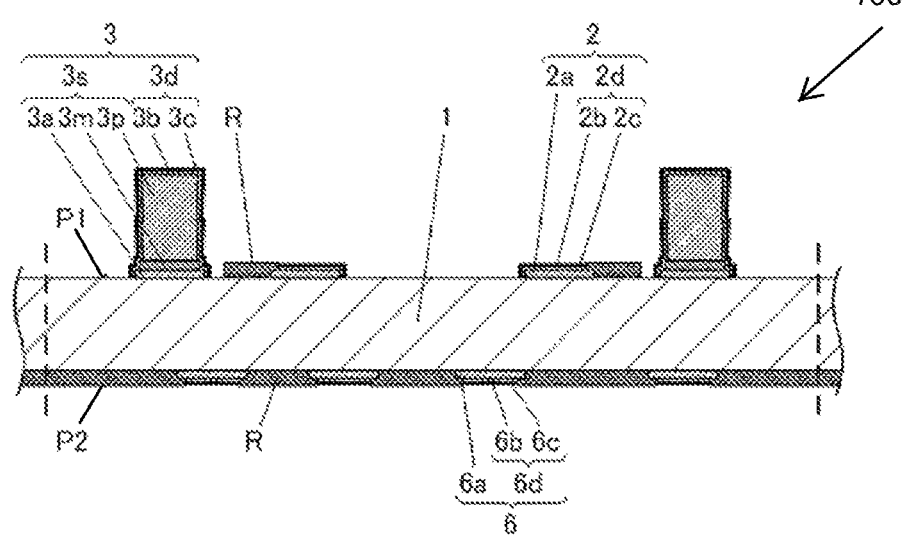
FIG. 1 is a sectional view of a circuit board according to an embodiment.

FIG. 1 is a schematic diagram, and the dimensions of an actual product are not necessarily reflected thereon. Also, variation in shapes of components that is made during a manufacturing process is not necessarily reflected on the drawings. That is, it can be said that the drawings used for the following description of the specification illustrate the actual product in an essential aspect even through there is a difference from the actual product.

FIG. 1 is a sectional view of the circuit board 100. The circuit board 100 includes a board body 1, first electrodes 2, second electrodes 3, and third electrodes 6. Each third electrode 6 is not an essential component of the invention. The board body 1 contains a resin material. An example of the board body that contains the resin material is a so-called glass epoxy board in which an insulating layer is composed of a composite material that contains, for example, glass woven fabric or non-woven fabric and an insulating resin such as an epoxy resin.

However, the kind of the board body 1 is not limited thereto. For example, an inorganic material such as glass may not be contained. The resin material may be a liquid-crystal polymer. The board body 1 may have a single layer structure including no internal wiring or a multilayer structure including internal wiring.

Each first electrode 2 is disposed on a first main surface P1 of the board body 1 and includes a first electrode base 2a and a first coating film 2d. The first electrode base 2a has a plate shape and is composed of a metal material selected from, for example, Cu and a Cu alloy. However, the material of the first electrode base 2a is not limited thereto. The first coating film 2d includes a lower coating film 2b and an upper coating film 2c. An example of the lower coating film 2b is a Ni plating film. An example of the upper coating film 2c is an Au plating film. However, the first coating film 2d may have a single layer structure.

In the circuit board 100, a part of each first electrode base 2a is covered by a solder resist R in order to prevent a short circuit between the first electrodes 2 and the second electrodes 3 due to soldering when a first electronic component 4 is connected to the first electrodes 2, which will be described later. For this reason, each first coating film 2d covers a part of the outer surface of the first electrode base 2a that is not covered by the solder resist R. The solder resist R is not an essential component of the invention. Without the solder resist R, the entire outer surface of the first electrode base 2a may be covered by the first coating film 2d.

Each second electrode 3 is disposed on the first main surface P1 of the board body 1 and includes a pillar-shaped structure 3s and a second coating film 3d that covers the outer surface of the pillar-shaped structure 3s. The pillar-shaped structure 3s includes a second electrode base 3a, a first plating film 3m that is disposed on the second electrode base 3a, and a first plating structure 3p having a first end directly connected to the first plating film 3m.

Each first plating film 3m can be formed by, for example, electroless plating as described later. Each first plating structure 3p can be formed by electroplating as described later. The first plating film 3m and the first plating structure 3p are composed of, for example, Cu. However, the materials of the first plating film 3m and the first plating structure 3p are not limited thereto.

Each second electrode base 3a has a plate shape and is composed of a metal material selected from, for example, Cu and a Cu alloy. However, the material of the second electrode base 3a is not limited thereto. Each second coating film 3d includes a lower coating film 3b and an upper coating film 3c. An example of the lower coating film 3b is a Ni plating film. An example of the upper coating film 3c is an Au plating film. However, the second coating film 3d may have a single layer structure.

Each third electrode 6 is disposed on a second main surface P2 of the board body 1 and includes a third electrode base 6a and a third coating film 6d. An example of the third electrode base 6a is a Cu foil. The third coating film 6d includes a lower coating film 6b and an upper coating film 6c. An example of the lower coating film 6b is a Ni plating film. An example of the upper coating film 6c is an Au plating film. However, the third coating film 6d may have a single layer structure.

In the circuit board 100, a part of each third electrode base 6a is covered by a solder resist R in order to prevent a short circuit between the third electrodes 6 due to soldering when second electronic components 7 are connected to the third electrodes 6, which will be described later. For this reason, each third coating film 6d covers a part of the outer surface of the third electrode base 6a that is not covered by the solder resist R. The solder resist R is not an essential component of the invention as described above. Without the solder resist R, the entire outer surface of the third electrode base 6a may be covered by the third coating film 6d.

In the circuit board 100, each second electrode 3 serves as an external connection terminal after the electronic components are connected to the circuit board 100 to provide a circuit module 200 described later. That is, the circuit board 100 is easy to manufacture because a principal part of the second electrode 3 is manufactured by a plating method. The principal part of the second electrode 3 has a fine plating structure, and accordingly, its electric resistance is kept low.

<Method of Manufacturing Circuit Board>

FIG. 2A to FIG. 5B illustrate an example of a method of manufacturing the circuit board 100 that corresponds to the circuit board according to the embodiment of the invention. FIG. 2A to FIG. 2C, FIG. 3A to FIG. 3D, FIG. 4A to FIG. 4C, and FIG. 5A and FIG. 5B schematically illustrate processes that are sequentially performed in the example of the method of manufacturing the circuit board 100 with sectional views. FIG. 2A to FIG. 5B correspond to the sectional view of the circuit board 100 in FIG. 1.

In the description of the manufacturing method described below, sets of the circuit boards 100 are manufactured. However, the circuit board 100 may be individually manufactured.

Figure 2A:
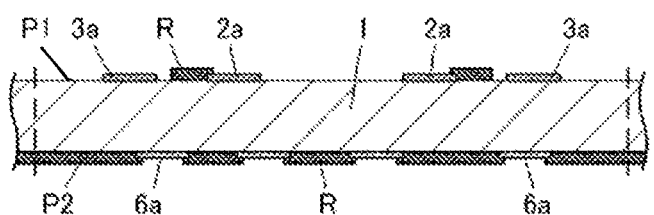
FIG. 2A illustrates an example of a method of manufacturing the circuit board according to the embodiment and schematically illustrates a part of a process with a sectional view.

FIG. 2A illustrates, with a sectional view, a process (first step) of manufacturing or preparing the board body 1 in which the first electrode bases 2a, the second electrode bases 3a, and the solder resists R are disposed on the first main surface P1, and the third electrode bases 6a and the solder resists R are disposed on the second main surface P2. The solder resists R at a side of the first main surface P1 cover the parts of the first electrode bases 2a for the above-described purpose. The solder resists R at a side of the second main surface P2 cover the parts of the third electrode bases 6a also for the above-described purpose. The solder resists R are appropriately selected from known materials.

Figure 2B:
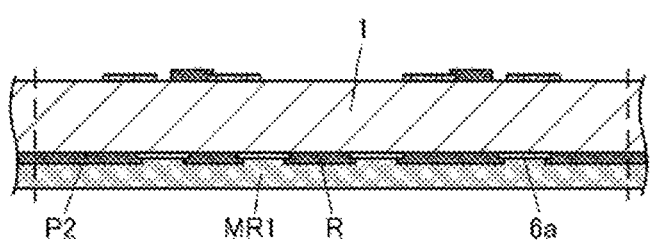
FIG. 2B illustrates the example of the method of manufacturing the circuit board according to the embodiment and schematically illustrates a part of the process with a sectional view.

FIG. 2B illustrates, with a sectional view, a process of forming a second-main-surface plating resist film MR1 at a side of the second main surface P2 of the board body 1 such that the third electrode bases 6a and the solder resists R are covered. The second-main-surface plating resist film MR1 is appropriately selected from known resist film materials.

Figure 2C:
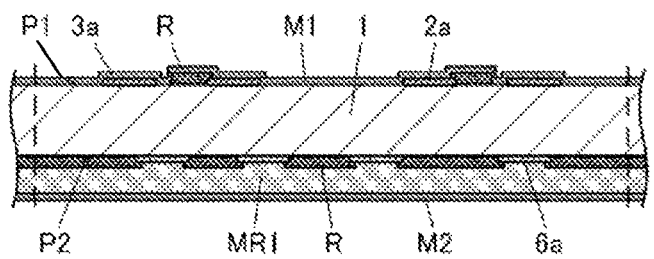
FIG. 2C illustrates the example of the method of manufacturing the circuit board according to the embodiment and schematically illustrates a part of the process with a sectional view.

FIG. 2C illustrates, with a sectional view, a process of forming a first power supply film M1 at a side of the first main surface P1 of the board body 1 by electroless plating such that the first electrode bases 2a, the second electrode bases 3a, and the solder resists R are covered. At this time, a second power supply film M2 is also formed on the second-main-surface plating resist film MR1. The first power supply film M1 and the second power supply film M2 are formed by, for example, electroless Cu plating.

That is, FIG. 2B and FIG. 2C illustrate, with the sectional views, a process (second step) of forming the first power supply film M1 at a side of the first main surface P1 of the board body 1 such that the outer surface of each second electrode base 3a is covered by electroless plating.

Figure 3A:
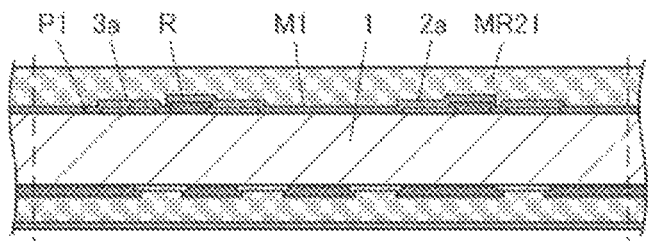
FIG. 3A illustrates the example of the method of manufacturing the circuit board according to the embodiment and schematically illustrates a process subsequent to those in FIG. 2A to FIG. 2C with a sectional view.
Figure 3B:
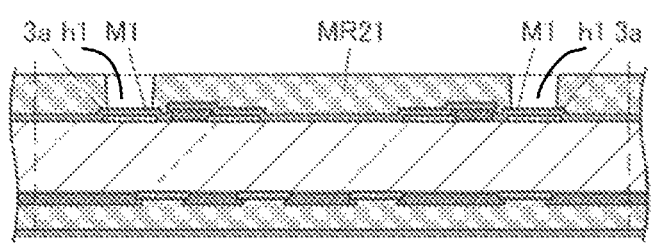
FIG. 3B illustrates the example of the method of manufacturing the circuit board according to the embodiment and schematically illustrates a process subsequent to those in FIG. 2A to FIG. 2C with a sectional view.

FIG. 3A illustrates, with a sectional view, a process of forming a lower first-main-surface plating resist film MR21 at a side of the first main surface P1 of the board body 1 such that the first power supply film M1 is covered. The lower first-main-surface plating resist film MR21 is appropriately selected from known photoresist film materials. FIG. 3B illustrates, with a sectional view, a process of forming openings h1 such that at least parts of the first power supply film M1 on the second electrode bases 3a are exposed as a result of the lower first-main-surface plating resist film MR21 being exposed to light and developed.

Figure 3C:
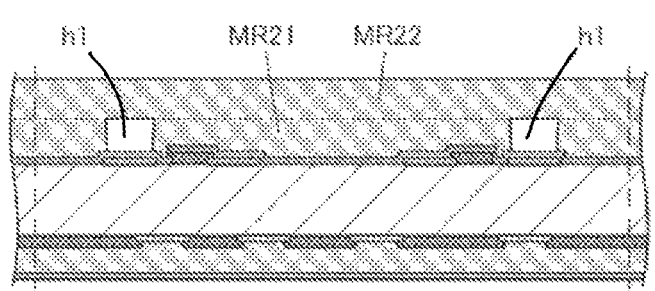
FIG. 3C illustrates the example of the method of manufacturing the circuit board according to the embodiment and schematically illustrates a process subsequent to those in FIG. 2A to FIG. 2C with a sectional view.
Figure 3D:
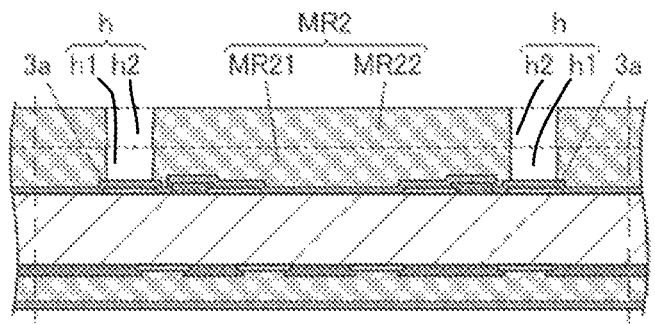
FIG. 3D illustrates the example of the method of manufacturing the circuit board according to the embodiment and schematically illustrates a process subsequent to those in FIG. 2A to FIG. 2C with a sectional view.

FIG. 3C illustrates, with a sectional view, a process of forming an upper first-main-surface plating resist film MR22 on the lower first-main-surface plating resist film MR21. The upper first-main-surface plating resist film MR22 is appropriately selected from known photoresist film materials. FIG. 3D illustrates, with a sectional view, a process of forming openings h2 such that at least parts of the first power supply film M1 on the second electrode bases 3a are exposed through the openings h1 as a result of the upper first-main-surface plating resist film MR22 being exposed to light and developed.

Consequently, the lower first-main-surface plating resist film MR21 and the upper first-main-surface plating resist film MR22 constitute a first-main-surface plating resist film MR2 that has openings h through which at least the parts of the first power supply film M1 on the second electrode bases 3a are exposed. That is, FIG. 3A to FIG. 3D illustrate, with the sectional views, a process (third step) of forming the first-main-surface plating resist film MR2 on the first power supply film M1 such that at least the parts of the first power supply film M1 on the second electrode bases 3a are exposed.

Figure 4A:
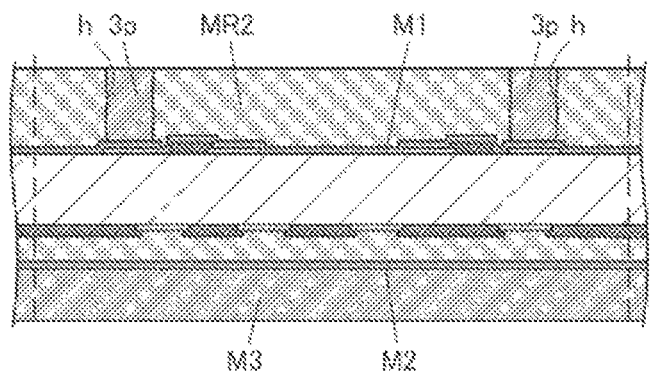
FIG. 4A illustrates the example of the method of manufacturing the circuit board according to the embodiment and schematically illustrates a process subsequent to those in FIG. 3A to FIG. 3D with a sectional view.

FIG. 4A illustrates, with a sectional view, a process (fourth step) of forming the first plating structures 3p on the first power supply film M1 exposed through the openings h by electroplating with power supplied via the first power supply film M1 such that the first plating structures 3p are directly connected thereto. The first plating structures 3p are formed so as to follow the shapes of the openings h of the first-main-surface plating resist film MR2. At this time, a second plating structure M3 is also formed on the second power supply film M2 at a side of the second main surface. The materials of each first plating structure 3p and the second plating structure M3 are, for example, Cu.

Figure 4B:
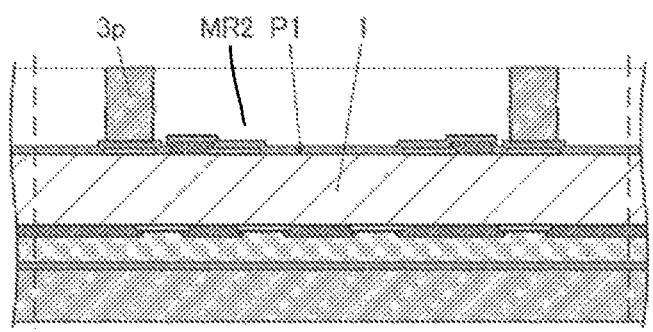
FIG. 4B illustrates the example of the method of manufacturing the circuit board according to the embodiment and schematically illustrates a process subsequent to those in FIG. 3A to FIG. 3D with a sectional view.

FIG. 4B illustrates a process (fifth step) of removing the first-main-surface plating resist film MR2 with a sectional view. For example, the first-main-surface plating resist film MR2 is removed by being dissolved with an organic solvent.

Figure 4C:
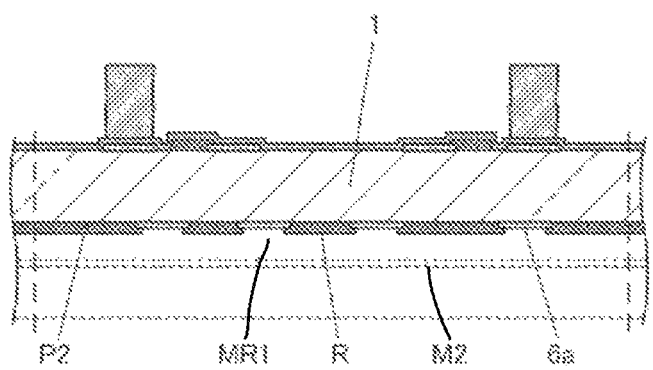
FIG. 4C illustrates the example of the method of manufacturing the circuit board according to the embodiment and schematically illustrates a process subsequent to those in FIG. 3A to FIG. 3D with a sectional view.

FIG. 4C illustrates a process of removing the second-main-surface plating resist film MR1, the second power supply film M2, and the second plating structure M3 with a sectional view. For example, these are removed by being mechanically separated.

Figure 5A:
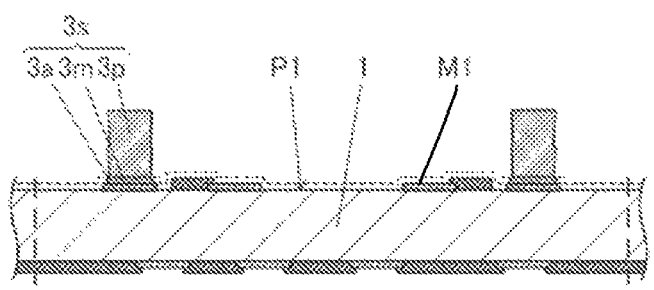
FIG. 5A illustrates the example of the method of manufacturing the circuit board according to the embodiment and schematically illustrates a process subsequent to those in FIG. 4A to FIG. 4C with a sectional view.

FIG. 5A illustrates, with a sectional view, a process (sixth step) of removing the first power supply film M1 except for portions that are directly connected to the first plating structures 3p and forming the pillar-shaped structures 3s. Each pillar-shaped structure 3s includes the second electrode base 3a, the first plating film 3m that corresponds to the remaining portion of the first power supply film M1 that is directly connected to the first plating structure 3p, and the first plating structure 3p having a first end directly connected to the first plating film 3m. The first power supply film M1 is removed by, for example, etching.

Figure 5B:
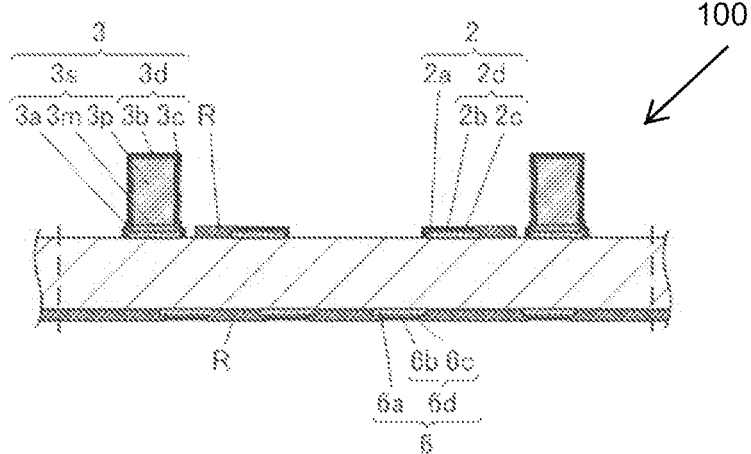
FIG. 5B illustrates the example of the method of manufacturing the circuit board according to the embodiment and schematically illustrates a process subsequent to those in FIG. 4A to FIG. 4C with a sectional view.

FIG. 5B illustrates a process (seventh step) of forming the first electrodes 2 and the second electrodes 3 with a sectional view. Each first electrode 2 is formed by forming the first coating film 2d in a region in which the outer surface of the first electrode base 2a is not covered by the solder resist R. The first coating film 2d of the circuit board 100 is formed by forming the Ni plating film serving as the lower coating film 2b, and forming the Au plating film serving as the upper coating film 2c thereon. However, the first coating film 2d may have a single layer structure.

Each second electrode 3 is formed by forming the second coating film 3d such that at least a part of the outer surface of the pillar-shaped structure 3s is covered. The second coating film 3d is formed by forming the Ni plating film serving as the lower coating film 3b and forming the Au plating film serving as the upper coating film 3c thereon as in the case of the first coating film 2d. However, the second coating film 3d may have a single layer structure.

At this time, each third coating film 6d is formed in a region in which the outer surface of the third electrode base 6a is not covered by the solder resist R. The third coating film 6d includes the Ni plating film serving as the lower coating film 6b and the Au plating film serving as the upper coating film 6c thereon as in the case of the first coating film 2d and the second coating film 3d. However, the third coating film 6d may have a single layer structure.

The method of manufacturing the circuit board 100 having the above features enables the circuit board to be readily manufactured, and the electric resistance of the circuit board is kept low because the principal part (the first plating film 3m and the first plating structure 3p) of each second electrode 3 has a fine plating structure.

(Circuit Module According to Embodiment)
<Structure of Circuit Module>

The structure of the circuit module 200 that corresponds to a circuit module according to an embodiment of the invention will be described with reference to FIG. 6.

Figure 6:
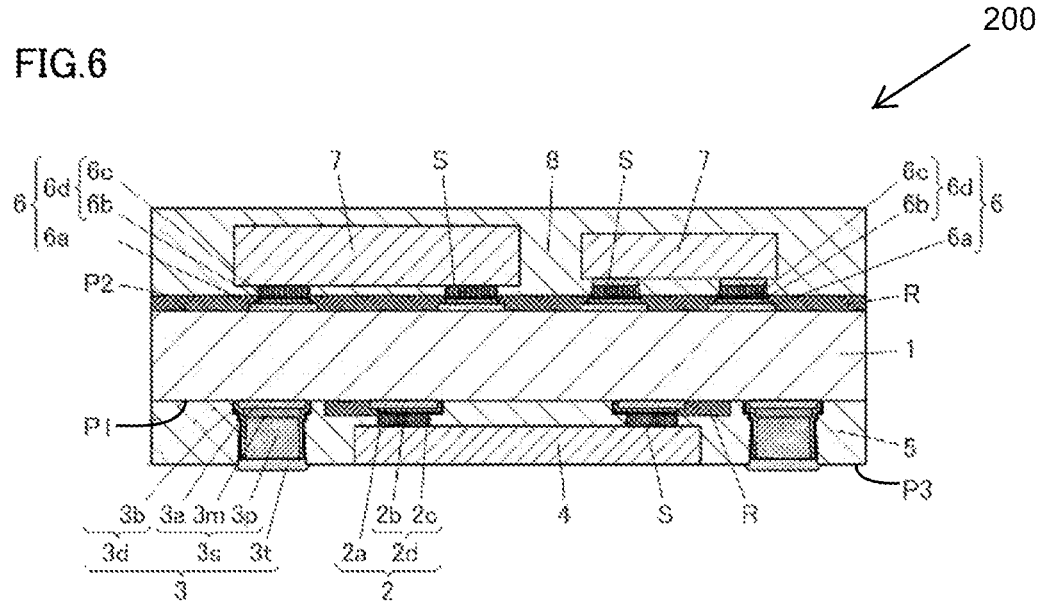
FIG. 6 is a sectional view of a circuit module according to an embodiment.

FIG. 6 is a sectional view of the circuit module 200. The circuit module 200 includes the circuit board 100, the first electronic component 4, a first resin layer 5, the second electronic components 7, and a second resin layer 8. Each second electrode 3 of the circuit board 100 also includes a coating portion 3t as described later. Components other than the above one are the same as those in the circuit board 100, and a description thereof is omitted. The second electronic components 7 and the second resin layer 8 are not essential components of the invention.

The first electronic component 4 is connected to the first electrodes 2 by using connection members S and located in the first resin layer 5 that is disposed at a side of the first main surface P1 of the board body 1 such that at least a part of a surface opposite to a surface facing the first electrodes 2 is exposed. The second electronic components 7 are connected to the third electrodes 6 by using connection members S, and the entire second electronic components 7 are covered by the second resin layer 8 that is disposed at a side of the second main surface P2 of the board body 1.

An example of the first electronic component 4 is an electronic component such as an IC or a circuit module smaller than the circuit module 200. An example of each second electronic component 7 is an electronic component such as a multilayer capacitor, a multilayer inductor, a filter, and an IC. An example of each connection member S is Pb-free Sn—Ag—Cu solder. The material of the connection member S is not limited thereto.

The first electronic component 4 is preferably connected to the first electrodes 2 and polished from the surface opposite to the surface facing the first electrodes 2 after the entire first electronic component 4 is covered by the first resin layer 5 once. Consequently, the thickness of the first electronic component 4 decreases to a thickness less than that before the first electronic component 4 is connected to the first electrodes 2. An outer surface P3 of the first resin layer 5 parallel to the first main surface of the board body 1 is flush with a polished section of the first electronic component 4.

This enables the thickness of the circuit module 200 to be decreased without using a thin IC that is difficult to handle, for example, in the case where the first electronic component 4 is an IC.

The first resin layer 5 and the second resin layer 8 are composed of a resin material in which a glass material or silica is dispersed as a filler. However, the first resin layer 5 and the second resin layer 8 may be composed of only a resin material. The first resin layer 5 and the second resin layer 8 may be composed of the same resin material or different resin materials.

A second end of the first plating structure 3p of each second electrode 3 is inside the outer surface P3 of the first resin layer 5 parallel to the first main surface P1 of the board body 1. The second coating film 3d is tubular and covers at least a part of a side surface of the pillar-shaped structure 3s so as not to cover the second end of the first plating structure 3p, and a first end of the second coating film 3d is flush with the second end of the first plating structure 3p.

The circuit module 200 includes the coating portion 3t, a first main surface of the coating portion 3t is connected to the first end of the second coating film 3d and the second end of the first plating structure 3p of each second electrode 3, and a second main surface thereof is outside the outer surface P3 of the first resin layer 5 parallel to the first main surface P1 of the board body 1.

The circuit module 200 includes the circuit board 100 according to the invention. Accordingly, the principal part (the first plating film 3m and the first plating structure 3p) of each second electrode 3 serving as the external connection terminal is manufactured by the plating method. That is, the circuit module 200 is easy to manufacture, and the electric resistance of the external connection terminal is kept low.

The circuit module 200, which has the above structure, reduces a stress acting at the interface of the contact between the external connection terminals and the connection members when being connected to the mother board of the electronic device. Accordingly, the reliability of the connection to the mother board of the electronic device increases.

<Method of Manufacturing Circuit Module>

FIG. 7A to FIG. 9C illustrate an example of a method of manufacturing the circuit module 200 that corresponds to the circuit module according to the embodiment of the invention. FIG. 7A to FIG. 7C, FIG. 8A and FIG. 8B, and FIG. 9A to FIG. 9C schematically illustrate processes that are sequentially performed in the example of the method of manufacturing the circuit module 200 with sectional views. FIG. 7A to FIG. 9C correspond to the sectional view of the circuit module 200 in FIG. 6.

In the description of the manufacturing method described below, sets of the circuit modules 20 are manufactured and divided into individual pieces. The reference characters in the figures for the description designate components of the sets of the circuit boards 100 and are not differentiated between the sets and the individual pieces.

The method of manufacturing the circuit board 100 (the first to seventh steps) for the circuit module 200 is the same as described above, and a description thereof is omitted here. A process of connecting the second electronic components 7, a process of forming the second resin layer 8, and a process of dividing the sets of the manufactured circuit modules 200 into the individual pieces are not essential processes of the invention.

Figure 7A:
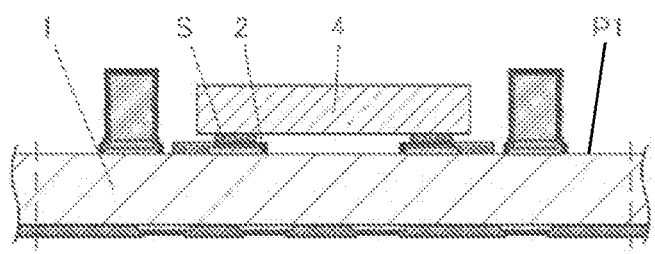
FIG. 7A illustrates an example of a method of manufacturing the circuit module according to the embodiment and schematically illustrates a part of a process with a sectional view.

FIG. 7A illustrates, with a sectional view, a process (eighth step) of connecting the first electronic component 4 to the first electrodes 2 that are formed at a side of the first main surface P1 of the board body 1 by using the connection members S. An example of each connection member S is a solder bump that has a Pb-free solder composition as above. The solder bump is formed, for example, at a side of the first electronic component 4. Ultrasonic vibration is created on the first electronic component 4 to connect the first electronic component 4 and the first electrodes 2 to each other with each solder bump interposed therebetween.

Figure 7B:
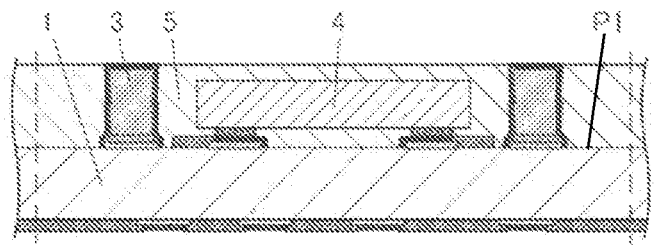
FIG. 7B illustrates the example of the method of manufacturing the circuit module according to the embodiment and schematically illustrates a part of the process with a sectional view.

FIG. 7B illustrates, with a sectional view, a process (ninth step) of disposing the first resin layer 5 at a side of the first main surface P1 of the board body 1 such that the entire first electronic component 4 and the second electrodes 3 are covered. A process of covering the first electronic component 4 and the second electrodes 3 by the first resin layer 5 is performed by a known method such as application of a resin material for formation of the first resin layer 5 at a side of the first main surface P1 of the board body 1.

Figure 7C:
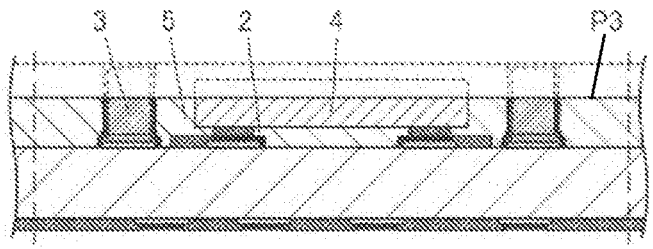
FIG. 7C illustrates the example of the method of manufacturing the circuit module according to the embodiment and schematically illustrates a part of the process with a sectional view.

FIG. 7C illustrates, with a sectional view, a process (tenth step) of polishing each second electrode 3, the first electronic component 4, and the first resin layer 5 from surfaces opposite to the surface of the first electronic component 4 facing the first electrodes 2. At this time, the thickness of the first electronic component 4 decreases to a thickness less than that before the first electronic component 4 is connected to the first electrodes 2, and the outer surface P3 that corresponds to the polished section of the first resin layer 5 and that is parallel to the first main surface P1 of the board body 1 is flush with the polished section of the first electronic component 4 and the polished section of the second electrode 3. Polishing can be known polishing such as lap polishing.

Figure 8A:
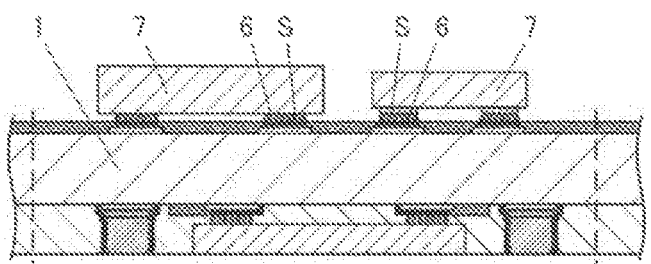
FIG. 8A illustrates the example of the method of manufacturing the circuit module according to the embodiment and schematically illustrates a process subsequent to those in FIG. 7A to FIG. 7C with a sectional view.

FIG. 8A illustrates, with a sectional view, a process of connecting the second electronic components 7 to the third electrodes 6 by using the connection members S. For example, each connection member S is selected from a solder bump having a Pb-free solder composition as above and solder paste.

The solder bump is formed, for example, at a side of the second electronic components 7. Ultrasonic vibration is created on the second electronic components 7 to connect the second electronic components 7 and the third electrodes 6 to each other with each solder bump interposed therebetween. For example, the solder paste is formed at a side of the third electrodes 6. The second electronic components 7 and the third electrodes 6 are connected to each other with solder that is melted and solidified interposed therebetween by reflow after the positions of the solder paste and the outer electrodes of the second electronic components 7 are adjusted. This process is not performed in the case where the circuit module 200 does not include the second electronic components 7.

Figure 8B:
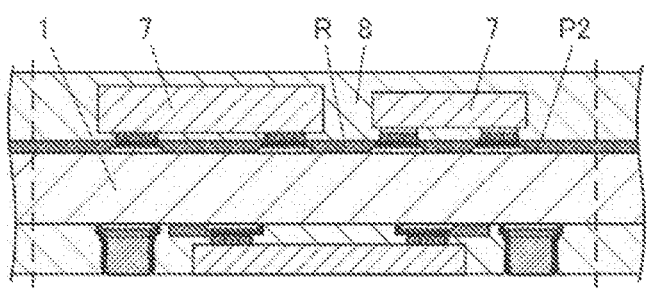
FIG. 8B illustrates the example of the method of manufacturing the circuit module according to the embodiment and schematically illustrates a process subsequent to those in FIG. 7A to FIG. 7C with a sectional view.

FIG. 8B illustrates, with a sectional view, a process of disposing the second resin layer 8 at a side of the second main surface P2 of the board body 1 such that the entire second electronic components 7 are covered. In FIG. 8B, the second resin layer 8 is disposed on the solder resists R. A process of covering the second electronic components 7 by the second resin layer 8 is performed by a known method such as application of the resin material for formation of the first resin layer 5 at a side of the first main surface P1 of the board body 1. This process is not performed in the case where the circuit module 200 does not include the second electronic components 7, and the second resin layer 8 for covering the second electronic components 7 is not needed.

Figure 9A:
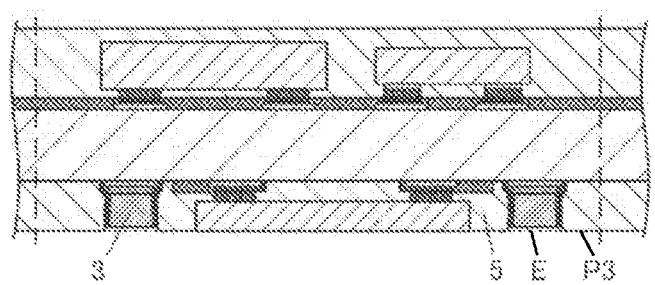
FIG. 9A illustrates the example of the method of manufacturing the circuit module according to the embodiment and schematically illustrates a process subsequent to those in FIG. 8A to FIG. 8B with a sectional view.

FIG. 9A illustrates, with a sectional view, a process (eleventh step) of etching the polished section of each second electrode 3 such that an exposed section of the second electrode 3 is inside the outer surface P3 of the first resin layer 5 parallel to the first main surface of the board body 1. Through this process, the exposed section of the second electrode 3 is located inside the outer surface P3 of the first resin layer 5 depending on an etching volume E.

Figure 9B:
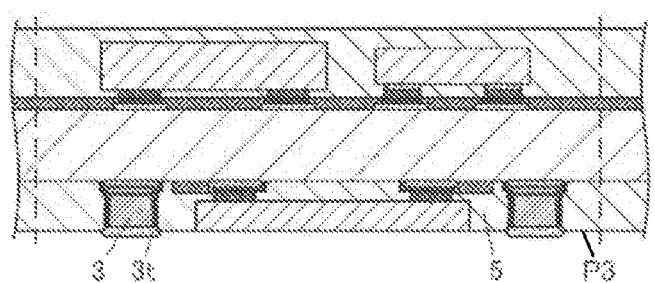
FIG. 9B illustrates the example of the method of manufacturing the circuit module according to the embodiment and schematically illustrates a process subsequent to those in FIG. 8A to FIG. 8B with a sectional view.

FIG. 9B illustrates, with a sectional view, a process (twelfth step) of forming the coating portions 3t such that the first main surfaces of the coating portions 3t are connected to the etched exposed sections of the second electrodes 3 and the second main surfaces thereof are located outside the outer surface P3 of the first resin layer 5 parallel to the first main surface P1 of the board body 1. The coating portions 3t can be formed by a known electroless plating method. At the end of this step, the sets of the circuit modules 200 are manufactured.

Figure 9C:
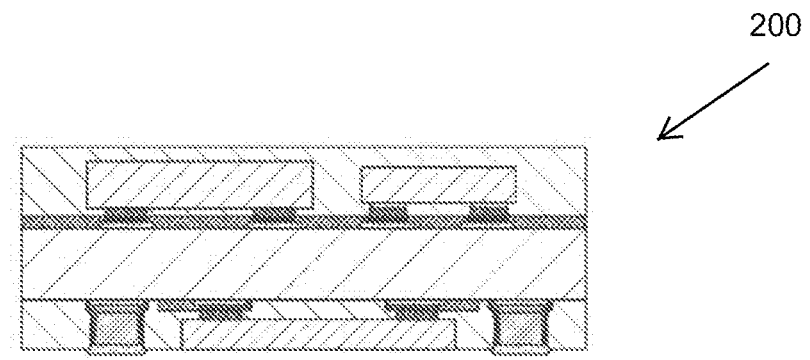
FIG. 9C illustrates the example of the method of manufacturing the circuit module according to the embodiment and schematically illustrates a process subsequent to those in FIG. 8A to FIG. 8B with a sectional view.
Figure 10:
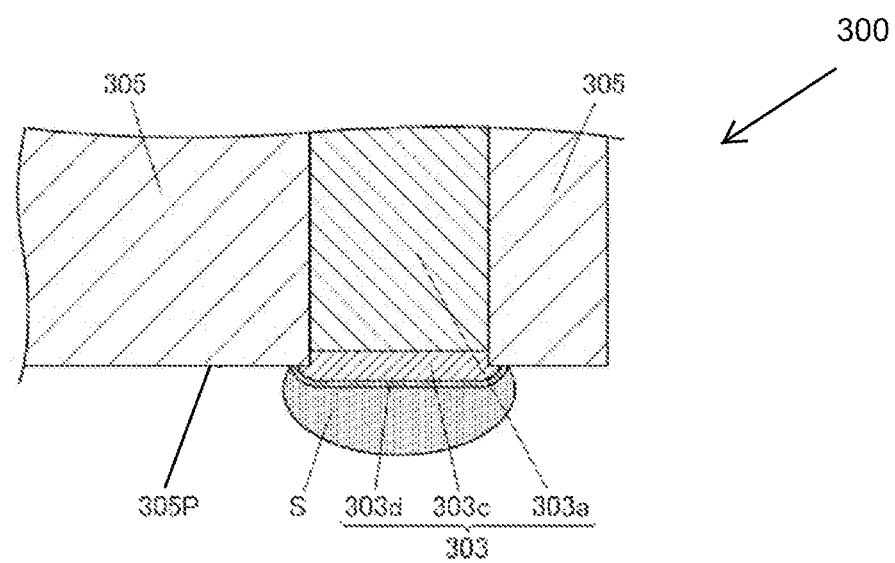
FIG. 10 is a sectional view of a principal part of a circuit module in the background art.

FIG. 9C illustrates a process of cutting the sets of the circuit module 200 into the individual pieces with a sectional view. Through this process, the circuit module 200 according to the invention is manufactured. This process is not performed in the case where the circuit module 200 is manufactured as the individual piece from the beginning.

The above method of manufacturing the circuit module 200 enables the circuit module 200 to be readily manufactured, and the electric resistance of the circuit module is kept low because the principal part (the first plating film 3m and the first plating structure 3p) of each external connection terminal has a fine plating structure, and the reliability of the connection to the mother board of the electronic device is high.

The embodiments of the present invention are described above. The embodiments are described herein by way of example in all aspects and are not restrictive. The scope of the present invention includes all modifications that are shown by claims and that have the same content and range as the claims.

100 board, 200 circuit module, 1 board body, 2 first electrode, 2a first electrode base, 2b lower coating film, 2c upper coating film, 2d first coating film, 3 second electrode (external connection terminal), 3a second electrode base, 3b lower coating film, 3c upper coating film, 3d second coating film, 3m first plating film, 3p first plating structure, 3s pillar-shaped structure, 3t coating portion, 4 first electronic component, 5 first resin layer, 6 third electrode, 6a third electrode base, 6b lower coating film, 6c upper coating film, 6d third coating film, 7 second electronic component, 8 second resin layer, M1 first power supply film, M2 second power supply film, M3 second plating structure, MR1 second-main-surface plating resist film, MR2 first-main-surface plating resist film, P1 first main surface, P2 second main surface, P3 outer surface of the first resin layer parallel to a first main surface of the board, R solder resist film, S connection member.

The invention claimed is:

1. A circuit module comprising:
a circuit board, a first electronic component, and a first resin layer,
wherein the circuit board comprises:
a board body;
a first electrode; and
a second electrode,
wherein the board body contains a resin material,
wherein the first electrode is disposed on a first main surface of the board body and includes a first electrode base and a first coating film, wherein the first coating film covers at least a part of an outer surface of the first electrode base, and
wherein the second electrode is disposed on the first main surface of the board body and includes a pillar-shaped structure and a second coating film, wherein the pillar-shaped structure includes a second electrode base, a first plating film disposed on the second electrode base, and a first plating structure having a first end directly connected to the first plating film, and wherein the second coating film covers at least a part of an outer surface of the pillar-shaped structure,
wherein the first resin layer is disposed at a side of the first main surface of the board body,
wherein the first electronic component is connected to the first electrode and located in the first resin layer such that at least a part of a surface opposite to a surface facing the first electrode is exposed,
wherein a second end of the first plating structure of the second electrode is inside an outer surface of the first resin layer parallel to the first main surface of the board body,
wherein the second coating film is tubular and covers the side surface of the second electrode base so as not to cover the second end of the first plating structure, and a first end of the second coating film is flush with the second end of the first plating structure, and
wherein a first main surface of a coating portion is connected to the first end of the second coating film and the second end of the first plating structure of the second electrode, and a second main surface of the coating portion is outside the outer surface of the first resin layer parallel to the first main surface of the board body.

* * * * *